United States Patent
Chen

(10) Patent No.: US 9,269,696 B2
(45) Date of Patent: Feb. 23, 2016

(54) LIGHT-EMITTING DEVICE

(75) Inventor: Wei-Yu Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 395 days.

(21) Appl. No.: 13/455,851

(22) Filed: Apr. 25, 2012

(65) Prior Publication Data

US 2013/0285075 A1    Oct. 31, 2013

(51) Int. Cl.
*H01L 33/08*    (2010.01)
*H01L 25/075*   (2006.01)
*H01L 33/42*    (2010.01)
*H01L 33/62*    (2010.01)

(52) U.S. Cl.
CPC ............ *H01L 25/0753* (2013.01); *H01L 33/42* (2013.01); *H01L 33/62* (2013.01); *H01L 2224/32225* (2013.01); *H01L 2224/48091* (2013.01); *H01L 2224/48227* (2013.01); *H01L 2224/49107* (2013.01); *H01L 2224/73265* (2013.01)

(58) Field of Classification Search
None
See application file for complete search history.

(56) References Cited

U.S. PATENT DOCUMENTS

| | | | |
|---|---|---|---|
| 5,376,580 A | 12/1994 | Kish et al. | |
| 2002/0096687 A1* | 7/2002 | Kuo et al. | 257/99 |
| 2004/0135166 A1* | 7/2004 | Yamada et al. | 257/103 |
| 2007/0200119 A1* | 8/2007 | Li | H01L 33/08 257/79 |
| 2007/0284598 A1* | 12/2007 | Shakuda et al. | 257/93 |
| 2012/0107979 A1* | 5/2012 | Moon et al. | 438/29 |

FOREIGN PATENT DOCUMENTS

| | | |
|---|---|---|
| TW | 311287 | 7/1997 |
| TW | 463395 | 11/2001 |
| TW | 544948 | 8/2003 |
| TW | I253770 | 4/2006 |
| TW | 200921932 | 5/2009 |

* cited by examiner

*Primary Examiner* — Hrayr A Sayadian
(74) *Attorney, Agent, or Firm* — Ditthavong & Steiner, P.C.

(57) ABSTRACT

A light-emitting device includes a support substrate; a light-emitting stacked layer; transparent-conductive bonding layer; and a semiconductor contact layer. The light-emitting stacked layer includes a first semiconductor layer; an active layer; and a second semiconductor layer, wherein a polarity of the first semiconductor layer is different from that of the semiconductor layer. A first pad is formed on an exposed portion of the first semiconductor layer and a second pad is formed on the semiconductor contact layer. A polarity of the semiconductor contact layer is different from that of the second semiconductor layer.

17 Claims, 4 Drawing Sheets

LIGHT-EMITTING DEVICE

BACKGROUND

1. Technical Field

The present disclosure relates to a light-emitting device, and more particularly, to a light-emitting device having a transparent-conductive bonding layer.

2. Description of the Related Art

Light-emitting diodes (LEDs) have been applied widely to optical display devices, traffic signals, data storing devices, communication devices, illumination devices, and medical apparatuses. In a conventional LED 1, it includes an n-type semiconductor layer 12, an active layer 14, and a p-type semiconductor layer 16 sequentially formed on a substrate 10. A portion of the active layer 14 and the p-type semiconductor layer 16 are removed to expose a portion of the n-type semiconductor layer 12. An n-type electrode 11 and a p-type electrode 13 are formed on the n-type semiconductor layer 12 and the p-type semiconductor layer 16 respectively as FIG. 1 shows. A sheet resistance of the p-type semiconductor layer 16 is larger than that of the n-type semiconductor layer 13 so current spreading ability of the n-type semiconductor layer 12 is better than that of the p-type semiconductor layer 16. Thus, current cannot spread uniformly in the p-type semiconductor layer 16. Light emitted from the active layer 14 is extracted in a light-emitting region, and the light-emitting region is confined close to the p-type electrode 13 in top view because current cannot spread uniformly in the p-type semiconductor layer 16.

The LED 1 can be connected with other elements to form a light-emitting apparatus. FIG. 2 illustrates a schematic view of a conventional light-emitting apparatus. A light-emitting apparatus 2 includes a submount 20 with a circuit 202; a solder 22 on the submount 20, wherein the LED 1 is adhesively fixed on the submount 20 by the solder 22; and an electrical-connecting structure 24 electrically connecting the n-type electrode 11 and the p-type electrode 13 with the circuit 202. The submount 20 can be a lead frame or a mounting substrate for circuit design and improving heat dissipation of the light-emitting apparatus 2.

SUMMARY OF THE DISCLOSURE

A light-emitting device includes a support substrate; a plurality of light-emitting units on the support substrate; and a semiconductor contact layer on the adjacent light-emitting units, wherein each of the plurality of light-emitting units includes a light-emitting stacked layer and the light-emitting stacked layer includes an active layer. Transparent-conductive bonding layers are formed on the light-emitting stacked layers, wherein the semiconductor contact layer electrically connects with the transparent-conductive bonding layers thereof.

A light-emitting device includes a support substrate; a light-emitting stacked layer; a transparent-conductive bonding layer; and a semiconductor contact layer. The light-emitting stacked layer includes a first semiconductor layer; an active layer; and a second semiconductor layer, wherein a polarity of the first semiconductor layer is different from that of the second semiconductor layer. A first pad is formed on an exposed portion of the first semiconductor layer and a second pad is formed on the semiconductor contact layer. A sheet resistance of the semiconductor contact layer is less than that of the second semiconductor layer.

BRIEF DESCRIPTION OF THE DRAWINGS

The accompanying drawings are included to provide easy understanding of the application, are incorporated herein and constitute a part of this specification. The drawings illustrate embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1:
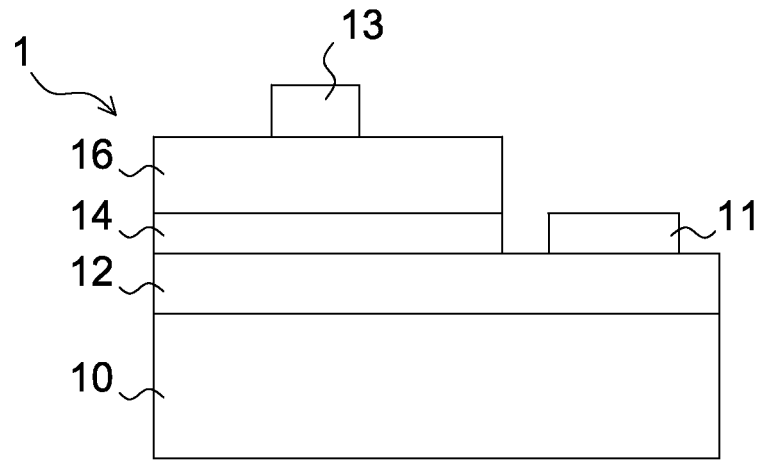
FIG. 1 illustrates a cross-sectional view of a conventional LED.
Figure 2:
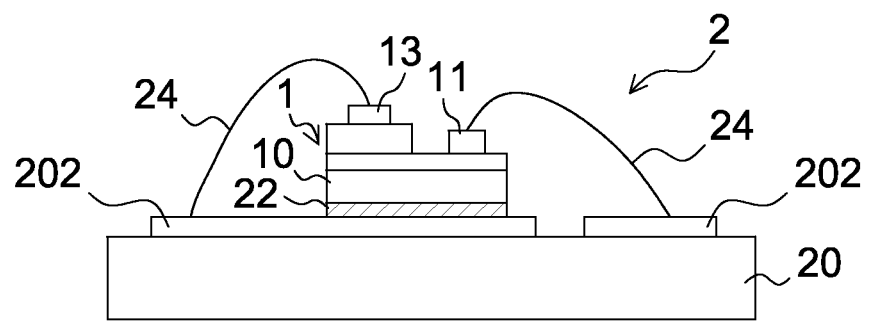
FIG. 2 illustrates a schematic view of a conventional light-emitting apparatus.
Figure 3:
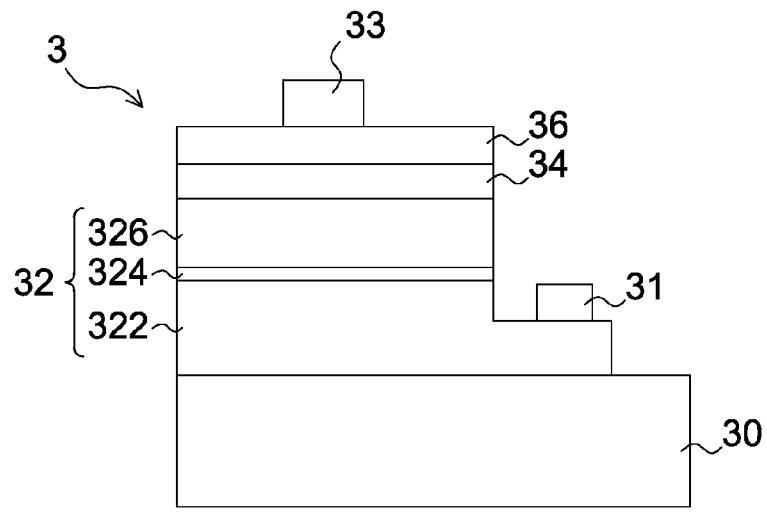
FIG. 3 illustrates a cross-sectional view of a light-emitting device in accordance with an embodiment of the present application.

FIG. 3 disclose a light-emitting device 3 according to an embodiment of the present disclosure. Referring to FIG. 3, the light-emitting device 3 includes an LED having a support substrate 30; a light-emitting stacked layer 32 on the support substrate 30; a transparent-conductive bonding layer 34 on the light-emitting stacked layer 32; and a semiconductor contact layer 36 on the transparent-conductive bonding layer 34. The light-emitting stacked layer 32 includes a first semiconductor layer 322; an active layer 324; and a second semiconductor layer 326, wherein a polarity of the first semiconductor layer 322 is different from that of the second semiconductor layer 326. A first pad 31 is formed on an exposed portion of the first semiconductor layer 322 and a second pad 33 is formed on the semiconductor contact layer 36. A sheet resistance of the semiconductor contact layer 36 is less than that of the second semiconductor layer 326. The polarity of the semiconductor contact layer 36 is n-type and the polarity of the second semiconductor layer is p-type, for example. The sheet resistance of the semiconductor contact layer 36 is about 10Ω/square and the sheet resistance of the second semiconductor layer 326 is about 10000Ω/square. Because the sheet resistance of the semiconductor contact layer 36 is less than that of the second semiconductor layer 326, current spreading ability of the semiconductor contact layer 36 is better than that of the p-type semiconductor layer 326 and current can spread uniformly in the light-emitting device 3. Light-emitting region can be broadened and is not confined close to the second pad 33 in top view. Thus, the light-emitting efficiency of the light-emitting device 3 can be improved. Furthermore, the p-type semiconductor layer cannot be too thick because of its high light absorption while it is difficult to roughen the p-type semiconductor layer without enough thickness. The semiconductor contact layer 36, however, can own enough thickness for the roughening process because of its less light absorption than the p-type semiconductor layer, and the light-emitting efficiency of the light-emitting device 3 can be therefore improved.

The support substrate 30 supports the light-emitting stacked layer 32 and other structure thereon. The material of the support substrate 30 includes conductive material such as Diamond Like Carbon (DLC), Metal Matrix Composite (MMC), Ceramic Matrix Composite (CMC), Polymer Matrix Composite (PMC), Cu, Al, Si Mo, Cu—Sn, Cu—Zn, Cu—Cd, Ni—Sn, Ni—Co, Au alloy, SiC, GaP, GaAsP, InP, LiGaO$_2$, or LiAlO$_2$, or insulating material such as diamond, glass, polymer, epoxy, quartz, acryl, Al$_2$O$_3$, ZnO, or MN.

The light-emitting stacked layer 32 can emit light. The polarities of the first semiconductor layer 322 and the second semiconductor layer 326 are different. A structure of the active layer 324 can include single heterostructure (SH), double heterostructure (DH), double-side double heterostructure (DDH), or multi-quantum well (MQW). The material of the light-emitting stacked layer 32 includes a semiconductor material containing more than one element selected from a group consisting of Ga, Al, In, As, P, N, Zn, Cd, and Se.

The transparent-conductive bonding layer 34 can adhesively connect the semiconductor contact layer 36 with the light-emitting stacked layer 32, and be transparent to the light emitted from the light-emitting stacked layer 32. The transparent-conductive bonding layer 34 can further includes a plurality of sub-layers (not shown). The material of the transparent-conductive bonding layer 34 can be transparent conductive material. The transparent conductive material includes but is not limited to ITO, InO, SnO, CTO, ATO, AZO, ZTO, ZnO, IZO, DLC, GZO, and so on.

The semiconductor contact layer 36 can electrically conduct and spread current. A polarity of the semiconductor contact layer 36 can be different from or the same as that of the second semiconductor layer 326. The polarity of the semiconductor contact layer 36 can be n-type or p-type. The sheet resistance of the semiconductor contact layer 36 is about 1Ω/square~20Ω/square. The semiconductor contact layer 36 can include a semiconductor material containing more than one element selected from a group consisting of Ga, Al, In, As, P, N, Zn, Cd, and Se.

The first pad 31 and the second pad 33 are for receiving external voltage. The materials of the first and second pads 31 and 33 can be transparent conductive material and/or metal material. The transparent conductive material includes but is not limited to ITO, InO, SnO, CTO, ATO, AZO, ZTO, ZnO, IZO, DLC, GZO, and so on. The metal material includes but is not limited to Cu, Al, In, Sn, Au, Pt, Zn, Ag, Ti, Ni, Pb, Pd, Ge, Ni, Cr, Cd, Co, Mn, Sb, Bi, Ga, W, Be, Ag—Ti, Cu—Sn, Cu—Zn, Cu—Cd, Sn—Pb—Sb, Sn—Pb—Zn, Ni—Sn, Ni—Co, Ag—Cu, Ge—Au, Au alloy, and so on.

Figure 4A:
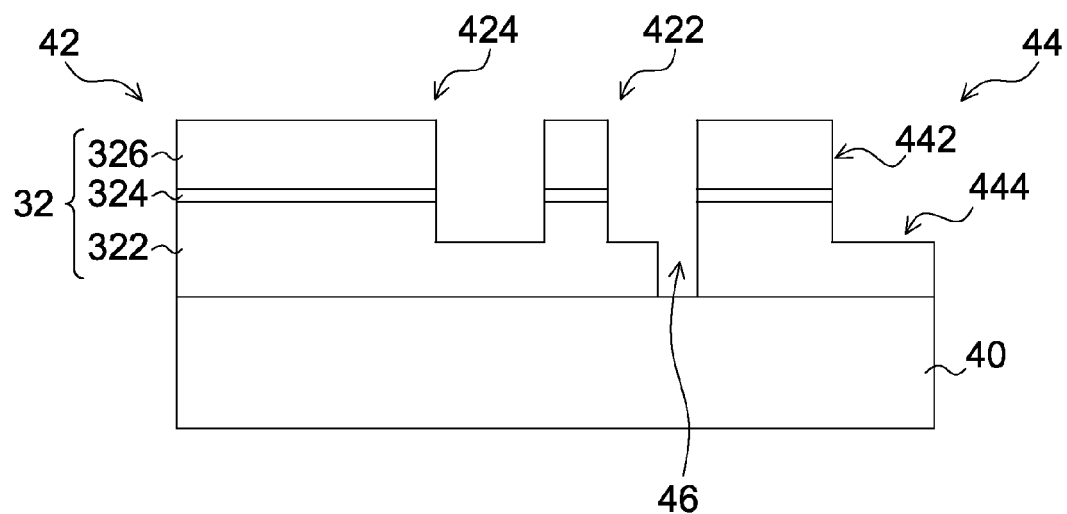
FIGS. 4A-4C illustrate a flow chart of the manufacturing process of a light-emitting device in accordance with another embodiment of the present application.
Figure 4B:
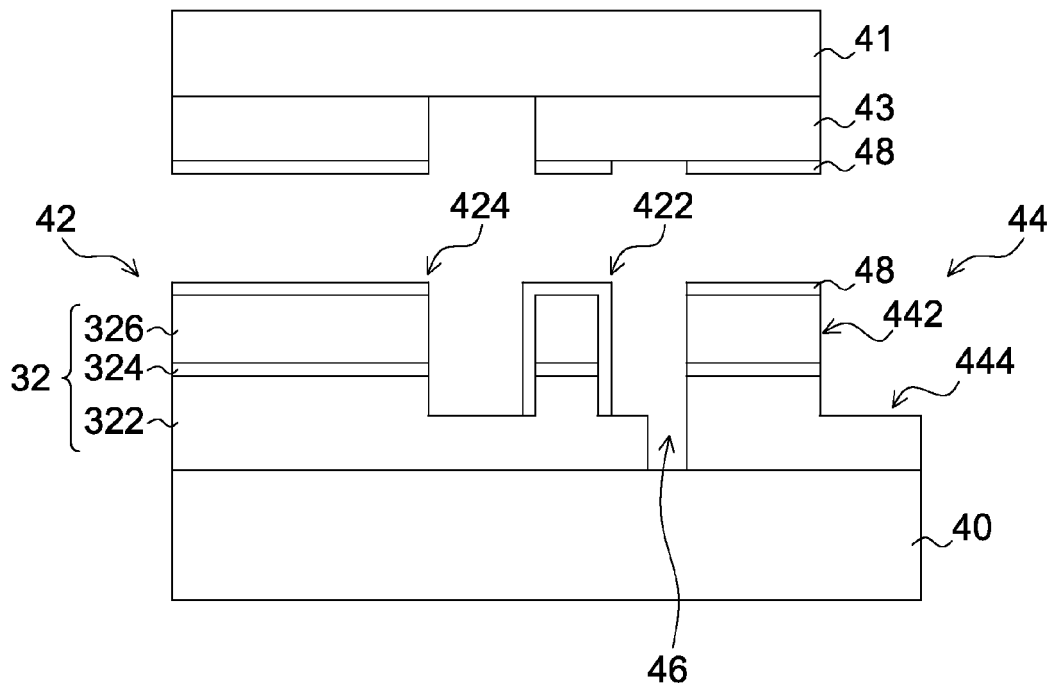
Figure 4C:
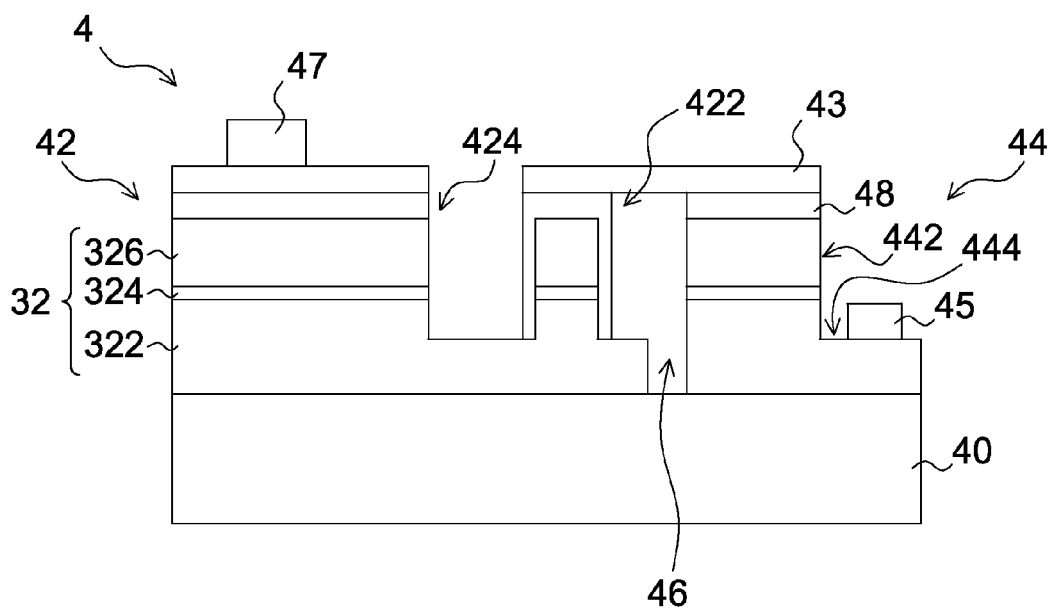

FIGS. 4A-4C disclose a flow chart of the manufacturing process of a light-emitting device 4 according to another embodiment of the present application. Referring to FIG. 4A, there are a first light-emitting unit 42 and a second light-emitting unit 44 on a support substrate 40. Each light-emitting unit includes the light-emitting stacked layer 32 having a first semiconductor layer 322; an active layer 324; and a second semiconductor layer 326, wherein a polarity of the first semiconductor layer 322 is different from that of the semiconductor layer 326. A groove 46 is formed between the first light-emitting unit 42 and the second light-emitting unit 44 to electrically isolate them. The groove 46 can be filled with an insulating material such as diamond, glass, polymer, epoxy, quartz, acryl, Al$_2$O$_3$, ZnO, or MN. The first light-emitting unit 42 includes a first mesa 422 and a second mesa 424 formed in the light-emitting stacked layer 32 to expose a portion of the first semiconductor layer 322, as shown in FIG. 4A. A portion of the light-emitting stacked layer 32 of the second light-emitting unit 44 is removed to form a third mesa 442 and an exposed portion 444 which exposes a portion of the first semiconductor layer 322. The tops of the first mesa 422 and the third mesa 442 are at about the same elevation from the top of the support substrate 40 for a subsequent bonding process.

Referring to FIG. 4B, semiconductor contact layers 43 are formed on a temporary substrate 41, wherein each semiconductor contact layer 43 is physically separated from each other, and a polarity of the semiconductor contact layer 43 is different from that of the second semiconductor layer 326. Transparent-conductive bonding layers 48 are formed on the first light-emitting unit 42 and the second light-emitting unit 44 and/or the semiconductor contact layers 43 optionally. The transparent-conductive bonding layers 48 can have flat surface after an evening process such as Chemical Mechanical Polishing (CMP). Top surfaces of the transparent-conductive bonding layers 48 are at the same elevation. The transparent-conductive bonding layer 48 can optionally extend along a lateral surface of the first mesa 422 and be physically in contact with the first semiconductor layer 322 thereof.

Referring to FIG. 4C, the semiconductor contact layers 43 are electrically connected with the first light-emitting unit 42 and the second light-emitting unit 44 by the transparent-conductive bonding layers 48 after the bonding process, wherein one of the semiconductor contact layers 43 electrically connects the first light-emitting unit 42 and the second light-emitting unit 44 in serial connection. Meanwhile, the semiconductor contact layer 43 can physically and/or electrically contact the transparent-conductive bonding layers 48. The groove 46 is covered by the semiconductor contact layers 43. After removing the temporary substrate 41, a first pad 45 and a second pad 47 are formed on the exposed portion 444 of the second light-emitting unit 44 and the semiconductor contact layer 43 of the second mesa 424 respectively to form the light-emitting device 4. Because the polarities of the semiconductor contact layer 43 and the second semiconductor layer 326 are different as the polarity of the semiconductor contact layer 43 is n-type and the polarity of the second semiconductor layer 326 is p-type, for example, and the sheet resistance of the semiconductor contact layer 43 is less than that of the second semiconductor layer 326, current spreading ability of the semiconductor contact layer 43 is better than that of the p-type semiconductor layer. Thus, current can spread uniformly in the light-emitting device 4, and light-emitting region thereof can be broadened and is not confined close to the second pad 47 in top view. Moreover, the transmittance of the semiconductor contact layer 43 is better than that of the metal lines which were used to be electrical connection between the light-emitting units so more light can be extracted from the semiconductor contact layer 43 in the light-emitting units of the present application. Thus, the light-emitting efficiency of the light-emitting device 4 can be improved.

The support substrate 40 supports the light-emitting units 42/44 and other structure thereon. The material of the support substrate 40 includes insulating material such as diamond, glass, polymer, epoxy, quartz, acryl, Al$_2$O$_3$, ZnO, or MN. The transparent-conductive bonding layer 48 can adhesively connect the semiconductor contact layer 48 with the light-emitting stacked layer 32, and be transparent to the light emitted from the light-emitting stacked layer 32. The transparent-conductive bonding layer 48 can further includes a plurality of sub-layers (not shown). The material of the transparent-conductive bonding layer 48 can be transparent conductive material which includes but is not limited to ITO, InO, SnO, CTO, ATO, AZO, ZTO, ZnO, IZO, DLC, GZO, and so on. The semiconductor contact layer 43 can electrically conduct and spread current. The sheet resistance of the semiconductor contact layer 43 is less than that of the second semiconductor layer 326. The sheet resistance of the semiconductor contact layer 48 can be 1Ω/square~20Ω/square. The polarity of the semiconductor contact layer 43 can be different from or the same as that of the second semiconductor layer 326. The polarity of the semiconductor contact layer 48 can be n-type or p-type. The semiconductor contact layer 48 can includes a semiconductor material containing more than one element selected from a group consisting of Ga, Al, In, As, P, N, Zn, Cd, and Se.

The first pad 45 and the second pad 47 are for receiving external voltage. The materials of the first and second pads 45 and 47 can be transparent conductive material and/or metal material. The transparent conductive material includes but is not limited to ITO, InO, SnO, CTO, ATO, AZO, ZTO, ZnO, IZO, DLC, GZO, and so on. The metal material includes but is not limited to Cu, Al, In, Sn, Au, Pt, Zn, Ag, Ti, Ni, Pb, Pd, Ge, Ni, Cr, Cd, Co, Mn, Sb, Bi, Ga, W, Be, Ag—Ti, Cu—Sn, Cu—Zn, Cu—Cd, Sn—Pb—Sb, Sn—Pb—Zn, Ni—Sn, Ni—Co, Ag—Cu, Ge—Au, Au alloy, and so on.

Figure 5:
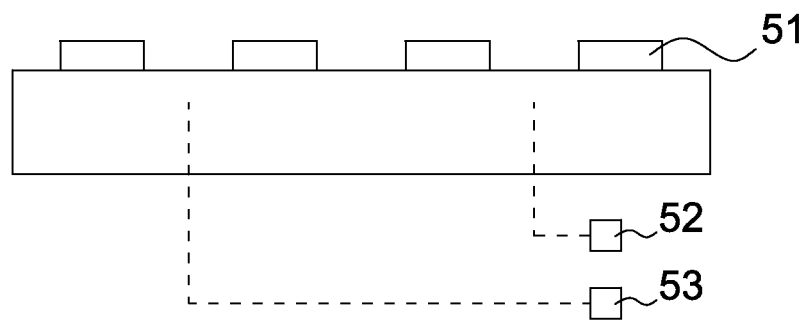
FIG. 5 illustrates a schematic diagram of a light-generating device in accordance with an embodiment of the present application.

FIG. 5 illustrates a schematic diagram of a light-generating device 5. The light-generating device 5 includes the light-emitting device of any one of the foregoing embodiments of the present application. The light-generating device 5 can be an illumination device such as a street light, a lamp of vehicle, or an illustration source for interior. The light-generating device 5 can be also a traffic sign or a backlight of a backlight module of an LCD. The light-generating device 5 includes a light source 51 adopting any foregoing light-emitting devices; a power supplying system 52 providing current to the light source 51; and a control element 53 controlling the power supplying system 52.

Figure 6:
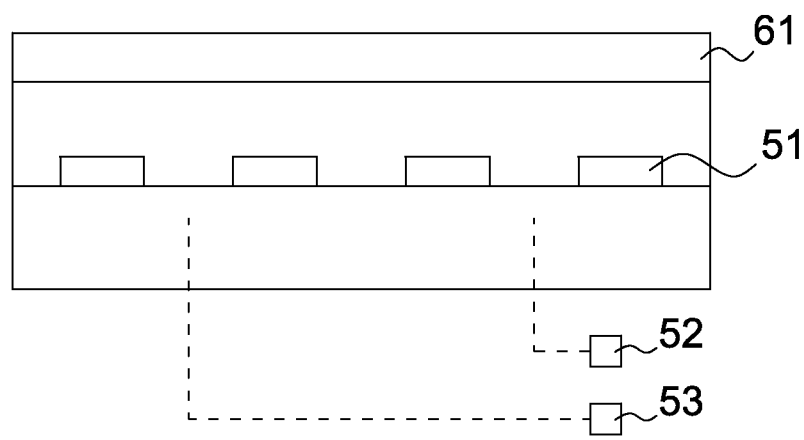
FIG. 6 illustrates a schematic diagram of a back light module in accordance with an embodiment of the present application.

FIG. 6 illustrates a schematic diagram of a back light module 6. A back light module 6 includes the light-generating device 5 of the foregoing embodiment and an optical element 61. The optical element 61 can process the light generated by the light-generating device 5 for LCD application, such as scattering the light emitted from the light-generating device 5.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a support substrate; a plurality of light-emitting units on the support substrate, wherein each of the plurality of light-emitting units comprises:
   a light-emitting stacked layer comprising an active layer;
a first semiconductor layer between the support substrate and the active layer; and
a second semiconductor layer on the active layer;
a transparent-conductive bonding layer on the light-emitting stacked layer; and
a semiconductor contact layer connecting two of the light-emitting units through the transparent-conductive bonding layer, wherein the semiconductor contact layer contacts and electrically connects the transparent-conductive bonding layers;

wherein the transparent-conductive bonding layer is between the semiconductor contact layer and the second semiconductor layer.

2. The light-emitting device of claim 1, wherein a polarity of the semiconductor contact layer is different from that of the second semiconductor layer.

3. The light-emitting device of 1, wherein a polarity of the semiconductor contact layer is the same as that of the second semiconductor layer.

4. The light-emitting device of claim 1, wherein a sheet resistance of the semiconductor contact layer is less than that of the second semiconductor layer.

5. The light-emitting device of claim 1, wherein top surfaces of the transparent-conductive bonding layers are at the same elevation.

6. The light-emitting device of claim 1, further comprising a groove between the two of the light-emitting units that are adjacent each other.

7. The light-emitting device of claim 6, wherein the groove is filled with an insulating material.

8. The light-emitting device of claim 7, wherein the insulating material is selected from a group consisting of diamond, glass, polymer, epoxy, quartz, acryl, $Al_2O_3$, ZnO, or AlN.

9. The light-emitting device of claim 1, wherein a material of the transparent-conductive bonding layer is selected from a group consisting of ITO, InO, SnO, CTO, ATO, AZO, ZTO, ZnO, IZO, YZO, GZO, and DLC.

10. The light-emitting device of claim 1, wherein the transparent-conductive bonding layer covers a lateral surface of the light-emitting unit.

11. The light-emitting device of claim 1, wherein a semiconductor material of the semiconductor contact layer comprises more than one element selected from a group consisting of Ga, Al, In, As, P, N, Zn, Cd, and Se.

12. A light-emitting device, comprising:
a substrate
a light-emitting stacked layer comprising:
   a first semiconductor layer on the substrate; an active layer on the first semiconductor layer; and
a second semiconductor layer on the active layer; a transparent-conductive bonding layer on the second semiconductor layer; a semiconductor contact layer on the transparent-conductive bonding layer, wherein a sheet resistance of the semiconductor contact layer is less than that of the second semiconductor layer; a first pad on the first semiconductor layer; and a second pad on the semiconductor contact layer;
wherein the semiconductor contact layer is a single layer, a polarity of the semiconductor contact layer is different from that of the second semiconductor layer and the same as that of the first semiconductor layer.

13. The light-emitting device of claim 12, wherein a semiconductor material of the semiconductor contact layer comprises more than one element selected from a group consisting of Ga, Al, In, As, P, N, Zn, Cd, and Se.

14. The light-emitting device of claim 12, wherein the polarity of the semiconductor contact layer is n type.

15. The light-emitting device of claim 12, wherein the polarity of the semiconductor contact layer is p type.

16. The light-emitting device of claim 1, wherein the plurality of light-emitting units are electrically connected in series.

17. The light-emitting device of claim 1, wherein a top surface of one of the light-emitting units and a top surface of another one of the light-emitting units are in a plane, and the transparent-conductive layer is on the plane and between the plane and the semiconductor contact layer.

* * * * *